United States Patent
Itabashi et al.

(10) Patent No.: US 9,608,581 B2
(45) Date of Patent: Mar. 28, 2017

(54) DIFFERENTIAL AMPLIFIER

(71) Applicant: SUMITOMO ELECTRIC INDUSTRIES, LTD., Osaka-shi, Osaka (JP)

(72) Inventors: Naoki Itabashi, Yokohama (JP); Taizo Tatsumi, Yokohama (JP); Keiji Tanaka, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/079,895

(22) Filed: Mar. 24, 2016

(65) Prior Publication Data

US 2016/0285427 A1 Sep. 29, 2016

(30) Foreign Application Priority Data

Mar. 27, 2015 (JP) .................. 2015-065971

(51) Int. Cl.
*H03F 3/45* (2006.01)
*H03G 1/00* (2006.01)
*H03G 3/30* (2006.01)

(52) U.S. Cl.
CPC ....... *H03G 1/0023* (2013.01); *H03F 3/45089* (2013.01); *H03F 3/45618* (2013.01); *H03G 1/0082* (2013.01); *H03G 3/3084* (2013.01); *H03F 2200/78* (2013.01); *H03F 2203/45038* (2013.01); *H03F 2203/45112* (2013.01)

(58) Field of Classification Search
CPC ....................................................... H03F 3/45
USPC ....................................... 330/254, 260, 261
See application file for complete search history.

(56) References Cited

U.S. PATENT DOCUMENTS

| | | | |
|---|---|---|---|
| 6,985,036 B2 * | 1/2006 | Bhattacharjee | H03F 3/45183 330/253 |
| 7,492,222 B2 * | 2/2009 | Cowley | H03F 3/45089 330/124 R |
| 8,531,241 B1 * | 9/2013 | Cohen | H03F 3/45183 330/253 |
| 8,941,440 B2 * | 1/2015 | Tanaka | H03F 3/4508 330/254 |

(Continued)

FOREIGN PATENT DOCUMENTS

| | | |
|---|---|---|
| JP | S61-219208 A | 9/1986 |
| JP | S62-245810 A | 10/1987 |
| JP | 2012-028859 A | 2/2012 |

*Primary Examiner* — Henry Choe
(74) *Attorney, Agent, or Firm* — Global IP Counselors, LLP

(57) ABSTRACT

A differential amplifier includes an amplifying stage that outputs an output signal by amplifying an input signal with a gain set by a control signal, and an adjusting stage that stabilizes a DC level of the output signal. The amplifying stage includes a first source supplying a first current, and a load, and determines a ratio of a current flowing through the load to the first current depending on the input signal and the control signal, and generates the output signal from a voltage drop of the load. The adjusting stage includes a second source supplying a second current, and a monitor resistor, and generates a monitor current divided from the second current by the ratio, and duplicates the DC level as a voltage drop of the monitor resistor caused by the monitor current, and controls the first current source and the second current source depending on the DC level.

13 Claims, 7 Drawing Sheets

(56) References Cited

U.S. PATENT DOCUMENTS

2012/0018622 A1\* 1/2012 Sugimoto ................. H03F 3/08
250/214 A
2014/0333381 A1\* 11/2014 Foroudi .................... H03F 3/45
330/254

\* cited by examiner

DIFFERENTIAL AMPLIFIER

CROSS-REFERENCE TO RELATED APPLICATIONS

This application claims priority to Japanese Patent Application No. 2015-065971, filed on Mar. 27, 2015. The entire disclosure of Japanese Patent Application No. 2015-065971 is hereby incorporated herein by reference.

BACKGROUND OF THE INVENTION

1. Field of the Invention

The present invention relates to a differential amplifier, and more specifically to a variable gain differential amplifier.

2. Description of the Related Art

Hitherto, variable gain amplifiers have been used in communications applications. A variable gain amplifier amplifies an input signal to an output signal by a gain. The gain is variable by inputting a gain control signal from the outside. The variable gain amplifier can vary the gain in response to the gain control signal without interrupting the amplification.

Assuming that voltage amplitude of the input signal is kept constant, when the voltage gain is varied, voltage amplitude of the output signal changes in response to the voltage gain. If the peak level of the output signal is fixed to a reference potential, the DC level, corresponding to the center level, of the output signal moves downward when the voltage amplitude of the output signal increases. In order to stabilize the DC level, some variable gain amplifiers have been studied.

For example, Japanese Unexamined Patent Application Publication Nos. 61-219208, 62-245810, and 2012-28859 disclose amplifiers that have such a stabilization mechanism. A variable gain amplifier disclosed by Japanese Unexamined Patent Application Publication No. 61-219208 has two pairs of bipolar transistors, and adds collector current of one of the first paired transistors and collector current of one of the second paired transistors, and equidistributes the sum collector current to collector current of the other of the first paired transistors and collector current of the other of the second paired transistors. A variable gain amplifier disclosed by Japanese Unexamined Patent Application Publication No. 62-245810 has two differential amplifiers, and sum a current that does not flow through a resistive load of the first differential amplifier and a current that does not flow through a resistive load of the second differential amplifier to each other, and divide the sum of the currents into two output currents each flowing through the resistive loads. A variable gain differential amplifier disclosed by Japanese Unexamined Patent Application Publication No. 2012-28859 includes an adjustment circuit that includes two differential amplifiers and two current sources, and adjusts the respective DC levels of complementary output voltages in response to changes in voltage gain.

Variable gain amplifiers of the related art have complicated mechanisms for stabilizing the DC level of an output signal against changes in voltage gain. Such complicated mechanisms need large circuit size and large power consumption.

SUMMARY OF THE INVENTION

According to an aspect of the present invention, there is provided a differential amplifier that generates an output signal derived from an input signal. The output signal and input signal each have a positive phase signal and a negative phase signal. The differential amplifier according to the aspect of the invention includes an amplifying stage that generating the output signal and an adjusting stage that generates a current control signal to stabilize a DC level of the output signal. The amplifying stage includes a first current source, a first differential circuit, a second differential circuit, a third differential circuit. The first current source supplies a first source current. The first differential circuit divides the first source current into a first current and a second current in response to the input signal. The second differential circuit divides the second current into a third current and a fourth current by a current ratio, and generates the negative phase signal of the output signal. The negative phase signal of the output signal has a potential that is proportional to the fourth current. The third differential circuit divides the second current into a fifth current and a sixth current by the current ratio, and generates the positive phase signal of the output signal. The positive phase signal has a potential that is proportional to the fifth current. The adjusting stage includes a second current source, a fourth differential circuit, and a controller. The second current source supplies a second source current. The fourth differential circuit divides the second source current into a seventh current and an eighth current by the current ratio, and generates monitor signal. The monitor signal has a potential that is proportional to the eighth current. The controller generates the control signal in response to the monitor signal. The current ratios of the fourth current to the third current, the fifth current to the sixth current, and eight current to the seventh current are identical and depend on a gain control signal provided externally. The first source current and the second source current are controlled in response to the current control signal.

According to the present invention, the variable gain amplifier can stabilize the DC level of the output signal and simultaneously achieve circuit downsizing and power saving, which are suitable for communication applications.

DESCRIPTION OF THE PREFERRED EMBODIMENTS

Figure 1:
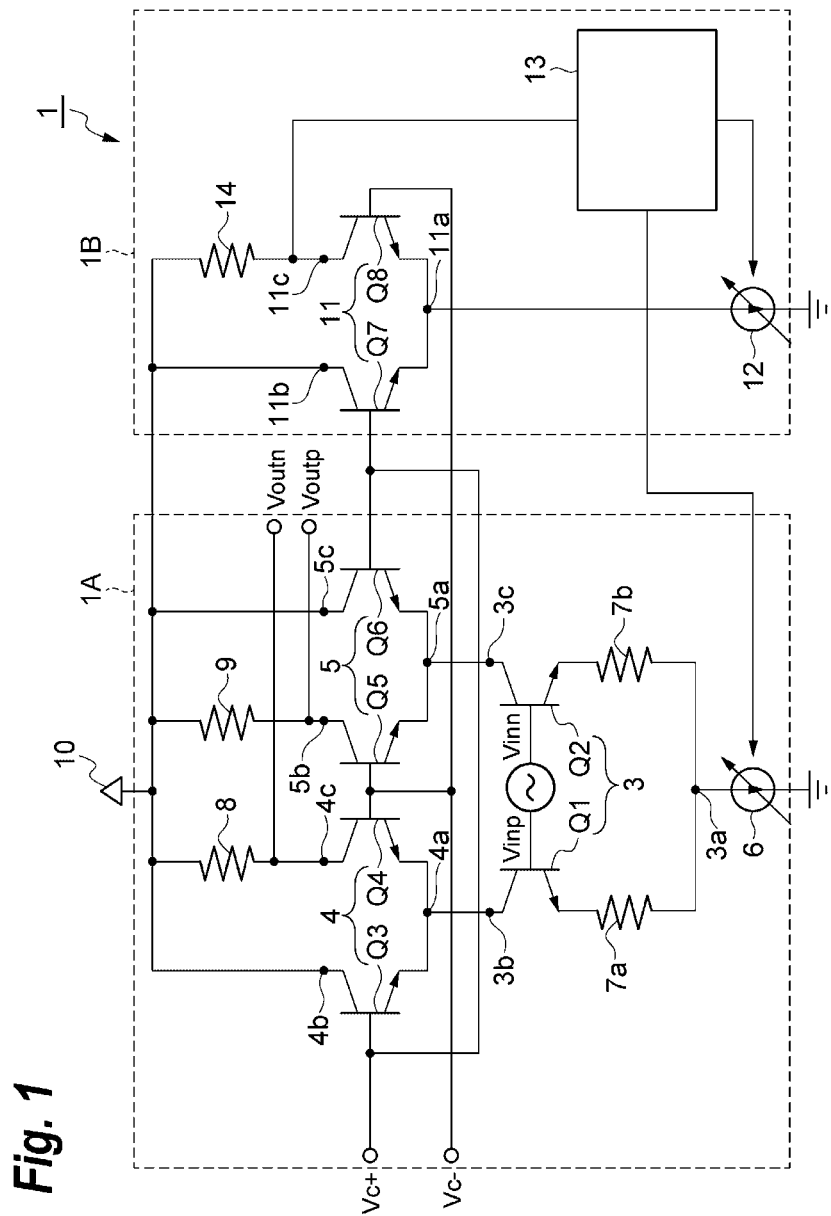
FIG. 1 is a circuit diagram of a variable gain differential amplifier according to an embodiment of the present invention.

Hereinafter, a variable gain differential amplifier according to an embodiment of the present invention will be described in detail with reference to the attached drawings. Note that the same components in the description of the drawings are indicated by the same reference numerals, and overlapping descriptions are omitted. Also, the term "transistor" includes both a bipolar transistor and a field-effect transistor (FET). Although the following description will discuss by way of example the case in which transistors are bipolar transistors, if transistors are FETs, the base, emitter, and collector are exchanged with the gate, source, and drain, respectively.

FIG. 1 is a circuit diagram of a variable gain differential amplifier according to an embodiment of the present invention. A variable gain differential amplifier 1 illustrated in FIG. 1 may be used in optical communications applications, and for example may be installed in an optical transceiver as a drive circuit for an optical modulator. The variable gain differential amplifier 1 according to the embodiment has an amplifying stage 1A and an adjusting stage 1B. The amplifying stage 1A includes a first differential circuit 3, a second differential circuit 4, a third differential circuit 5, and a first current source 6.

The first differential circuit 3 includes a pair of transistors Q1 and Q2, and has a common terminal 3a and terminals 3b and 3c. The emitters (first current terminals) of the transistors Q1 and Q2 are connected to the common terminal 3a through resistors 7a and 7b, respectively. That is, the emitters of the transistors Q1 and Q2 are connected to each other through a series circuit of the resistors 7a and 7b. The emitter of the transistor Q1 is connected to the first current source 6 through the resistor 7a and the common terminal 3a. Likewise, the emitter of the transistor Q2 is connected to the first current source 6 through the resistor 7b and the common terminal 3a.

Complimentary input signals Vinp and Vinn are input from an external circuit (not illustrated) to the bases (control terminals) of the transistors Q1 and Q2, respectively. The input signal Vinp has a phase different by 180 degrees from that of the input signal Vinn. The input signals Vinp and Vinn constitute a pair of signals (a differential input signal), so that one moves complimentarily with the other. For example, when one of the input signals Vinp and Vinn increases, the other decreases, and, when one of the input signals Vinp and Vinn decreases, the other increases. When one of the input signals Vinp and Vinn reaches a peak level (high level), the other reaches a bottom level (low level).

Furthermore, the collectors (second current terminals) of the transistors Q1 and Q2 are connected to the terminals 3b and 3c, respectively. With such a configuration, the first differential circuit 3 divides a current (first source current) provided by the current source 6 through the common terminal 3a into a current (first current) flowing through the terminal 3b and a current (second current) flowing through the terminal 3c in response to the input signals Vinp and Vinn. Thus, the sum of the current (first current) flowing through the terminal 3b and the current (second current) flowing through the terminal 3c becomes always equal to the current (first source current) flowing through the common terminal 3a. Therefore, when the current (first current) flowing through the terminal 3b increases, the current (second current) flowing through the terminal 3c decreases, and, when the current (first current) flowing through the terminal 3b decreases, the current (second current) flowing through the terminal 3c increases. The maximum of each of the current (first current) flowing through the terminal 3b and the current (second current) flowing through the terminal 3c is equal to the current flowing through the common terminal 3a, that is, the current (first source current) provided by the current source 6. When one of the current (first current) flowing through the terminal 3b and the current (second current) flowing through the terminal 3c becomes a maximum, that is, equal to the current (first source current) flowing through the common terminal 3a, the other current becomes substantially zero (a minimum). A ratio (current ratio) of the current (first current) flowing through the terminal 3b to the current (second current) flowing through the terminal 3c can be determined by the input signals Vinp and Vinn. Also, A ratio (current ratio) of the current (first current) flowing through the terminal 3b to the current (first source current) flowing through the common terminal 3a and a ratio (current ratio) of the current (second current) flowing through the terminal 3c to the current (first source current) flowing through the common terminal 3a can be controlled by the input signals Vinp and Vinn.

The second differential circuit 4 includes a pair of transistors Q3 and Q4 each having an identical transistor size, and a common terminal 4a and terminals 4b and 4c. The emitters (first current terminals) of the transistors Q3 and Q4 are connected to the common terminal 4a. The common terminal 4a is connected to the collector (second current terminal) of the transistor Q1 through the terminals 3b. In addition, the collector (second current terminal) of the transistor Q3 is directly connected (that is, without being through a significant resistor) to a power line 10 through the terminal 4b. The collector of the transistor Q4 is connected to the power line 10 through the terminal 4c and a first resistive load 8 (load element).

The third differential circuit 5 includes a pair of transistors Q5 and Q6 each having the identical transistor size, and has a common terminal 5a and terminals 5b and 5c. The emitters (first current terminals) of the transistors Q5 and Q6 are connected to the common terminal 5a. The common terminal 5a is connected to the collector (second current terminal) of the transistor Q2 through the terminals 3c. The collector of the transistor Q5 is connected to the power line 10 through the terminal 5b and a second resistive load 9. The collector of the transistor Q6 is directly connected to the power line 10 through the terminal 5c. In this case, the transistor size of the transistors Q5 and Q6 is set to be identical to the transistor size of the transistors Q3 and Q4 of the second differential circuit 4.

A gain control signal $Vc_+$ is input to the bases (control terminals) of the transistors Q3 and Q6. A gain control signal $Vc_-$ is input to the bases of the transistors Q4 and Q5. The gain control signal $Vc_+$ has a phase different by 180 degrees from the gain control signal $Vc_-$. Therefore, when one of the gain control signals $Vc_+$ and $Vc_-$ has a positive phase, the other has a negative phase. The gain control signals $Vc_+$ and $Vc_-$ constitute a pair of signals (a gain control signal Vc), so that one moves complimentarily with the other. The gain control signal Vc is a signal for controlling the voltage gain of the variable gain differential amplifier 1. The gain control signal Vc corresponds to a potential difference $\Delta V$ between the gain control signals $Vc_+$ and $Vc_-$. Specifically, the second differential circuit 4 divides the current (first current) flowing through the common terminal 4a into a current (third current) flowing through the terminal 4b and a current (fourth current) flowing through the terminal 4c in response to the gain control signals $Vc_+$ and $Vc_-$. Likewise, the third differential circuit 5 divides the current (second current) flowing through the common terminal 5a into a current (fifth current) flowing through the terminal 5b and a current (sixth current) flowing through the terminal 5c in response to the gain control signals $Vc_+$ and $Vc_-$. In this case, the amplifying stage 1A is set such that the ratio (current ratio) of the current (fourth current) flowing through the terminal 4c to the current (third current) flowing through the terminal 4b becomes equal to the ratio (current ratio) of the current (fifth current) flowing through the terminal 5b to the current (sixth current) flowing through the terminal 5c. At that time, the ratio (current ratio) of the current (fourth current) flowing through the terminal 4c to the current (first current) flowing through the common terminal 4a is set to be equal to the ratio (current ratio) of the current (fifth current) flowing through the terminal 5b to the current (second current) flowing through the common terminal 5a. These ratios (current ratio) are set by inputting the gain control signals $Vc_+$ and $Vc_-$ from the outside.

The collector of the transistor Q4 and the collector of the transistor Q5 are connected to the terminals 4c and 5b, respectively. The terminals 4c and 5b supply output signals Voutn and Voutp that are complementary signals amplified from the input signals Vinp and Vinn. The output signal Voutn has a potential (first potential) generated from a voltage drop of the first resistive load (load element) 8 caused by the fourth current. The output signal Voutp has a potential (second potential) generated from a voltage drop of the second resistive load 9 caused by the fifth current. Accordingly, the amplifying stage 1A amplifies a differential input signal Vin=Vinp−Vinn to the difference between the potential (second potential) at the terminal 5b and the potential (first potential) at the terminal 4c as a differential output signal Vout=Voutp−Voutn. For example, when the voltage gain of the amplifying stage 1A is set to be A by the gain control signal Vc, this is represented as: Voutp−Voutn=A×(Vinp−Vinn). In this case, the voltage gain can be identified as a differential gain.

The adjusting stage 1B has a fourth differential circuit 11, a second current source 12, and a feedback circuit (controller) 13.

The fourth differential circuit 11 includes a pair of transistors Q7 and Q8 each having an identical transistor size, and a common terminal 11a and terminals 11b and 11c. The emitters (first current terminals) of the transistors Q7 and Q8 are connected to the common terminal 11a. The common 11a is connected to the second current source 12. The collector (second current terminal) of the transistor Q7 is directly connected to the power line 10 through the terminal 11b. The collector of the transistor Q8 is connected to the power line 10 through the terminal 11c and a third resistive load 14 (monitor resistor).

In this case, a current (second source current) provided by the second current source 12 to the fourth differential circuit 11 through the common terminal 11a is set to a value $I_1/\alpha$ (quotient) obtained by dividing a current $I_1$ (first source current) supplied by the first current source 6 to the first differential circuit 3 through the common terminal 3a, by a coefficient $\alpha$ ($\alpha$ is a real number greater than 1). That is, the second source current may be set to a quotient of the first source current I1 by the coefficient $\alpha$. In accordance with this, the adjusting stage 1B may set the resistance of the third resistive load 14 (monitor resistor) to $\alpha \times R_1$ obtained by multiplying the resistance $R_1$ of the first and second resistive loads 8 and 9 by the above-mentioned coefficient $\alpha$. That is, the resistance of the third resistive load 14 (monitor resistor) may be set to a product of the resistance $R_1$ and the coefficient $\alpha$. Note that the resistance of the third resistive load 14 (monitor resistor) may be set to $\alpha \times R_1/2$ with respect to the resistance $R_1$ of the first and second resistive loads 8 and 9. When the resistance of the third resistive load 14 (monitor resistor) is set to $\alpha \times R_1$, for example, a voltage drop $R_1 \times I_1$ of the third resistive load 14 (monitor resistor) caused by the current $I_1/\alpha$ generates the potential (monitor signal) at the terminal 11c a bottom level of the output signals Voutn and Voutp of the amplifying stage 1A when the voltage gain is set to maximum. In contrast, when the resistance of the third resistive load 14 (monitor resistor) is set to $\alpha \times R_1/2$, a voltage drop of the third resistive load 14 (monitor resistor) becomes $R_1 \times I_1/2$, which is namely equal to an average voltage of the differential output signal of the amplifying stage 1A when the voltage gain is set to maximum, because $R_1 \times I_1$ corresponds to amplitude of the differential output signal. The average voltage corresponds to the DC level of the output signals Voutp and Voutn. In addition, the transistor size of the transistors Q7 and Q8 of the fourth differential circuit 11 may be set to a transistor size shrunk from the transistor size of the transistors Q3, Q4, Q5, and Q6 included in the first and second differential circuits 4 and 5 by the above-mentioned coefficient $\alpha$. That is, the transistor size of the transistors Q7 and Q8 is set to a quotient of the transistor size of the transistors Q3, Q4, Q5, and Q6 by the coefficient $\alpha$. Alternatively, the transistor size of the transistors Q7 and Q8 may be set to be identical to the transistor size of the transistors Q3, Q4, Q5, and Q6.

The above-mentioned gain control signal $Vc_+$ is input to the base (control terminal) of the transistor Q7. The above-mentioned gain control signal $Vc_-$ is input to the base of the transistor Q8.

The fourth differential circuit 11 divides a current flowing through the common terminal 11a (second source current supplied by the second current source 12) into a current (seventh current) flowing through the terminal 11b and a current (eighth current) flowing through the terminal 11c in response to the gain control signals $Vc_+$ and $Vc_-$. As a result, the adjusting stage 1B sets a ratio (current ratio) of the current (eighth current) flowing through the terminal 11c to the current (seventh current) flowing through the terminal 11b to be identical to the ratio (current ratio) of the current (fourth current) flowing through the terminal 4c to the current (third current) flowing through the terminal 4b, and to the ratio (current ratio) of the current (fifth current) flowing through the terminal 5b to the current (sixth current) flowing through the terminal 5c. Accordingly, the ratio (current ratio) of the current (eighth current) flowing through the terminal 11c to the current flowing through the common terminal 11a (second source current supplied by the second current source 12) is set to be identical to the ratio of the current (fourth current) flowing through the terminal 4c to the current (first current) flowing through the common terminal 4a, and to the ratio of the current (fifth current) flowing through the terminal 5b to the current (second current) flowing through the common terminal 5a.

It is preferable that the transistors Q1 to Q8 be npn transistors, and also be hetero bipolar transistors (HBTs). Accordingly, the first to fourth differential circuits 3 to 5 and 11 may be suitably configured. For example, HBTs with superior high frequency characteristics can improve the frequency characteristics of a variable gain amplifier and thereby enhance high speed performance for driving an optical modulator.

An input terminal of the feedback circuit 13 is connected to the collector of the transistor Q8 of the fourth differential circuit 11 through the terminal 11c of the fourth differential circuit 11. An output terminal of the feedback circuit 13 is connected to the first current source 6 and the second current source 12. The feedback circuit 13 monitors the DC level (monitor signal) at the collector of the transistor Q8, and controls the current (first source current) provided by the first current source 6 and the current (second source current) provided by the second current source 12 in response to the DC level (monitor signal) by feedback control. The DC level (monitor signal) at the collector of the transistor Q8 is generated from a voltage drop the third resistive load 14 (monitor resistor) caused by the current (eighth current) flowing through and the terminal 11c. When the DC level (monitor signal) at the terminal 11c rises, the feedback circuit 13 increases the current (first source current) supplied by the first current source 6 and the current (second source current) supplied by the second current source 12 at the same rate. When the DC level (monitor signal) at the terminal 11c falls, the feedback circuit 13 decreases the current (first source current) supplied by the first current source 6 and the current (second source current) supplied by the second current source 12 at the same rate.
Thereby, the feedback circuit 13 controls the first current source 6 and the second current source 12 such that the DC level (monitor signal) at the terminal 11c will be stabilized at a predetermined value and simultaneously the DC level of the output signal will be stabilized at the predetermined value as described above.

Figure 2:
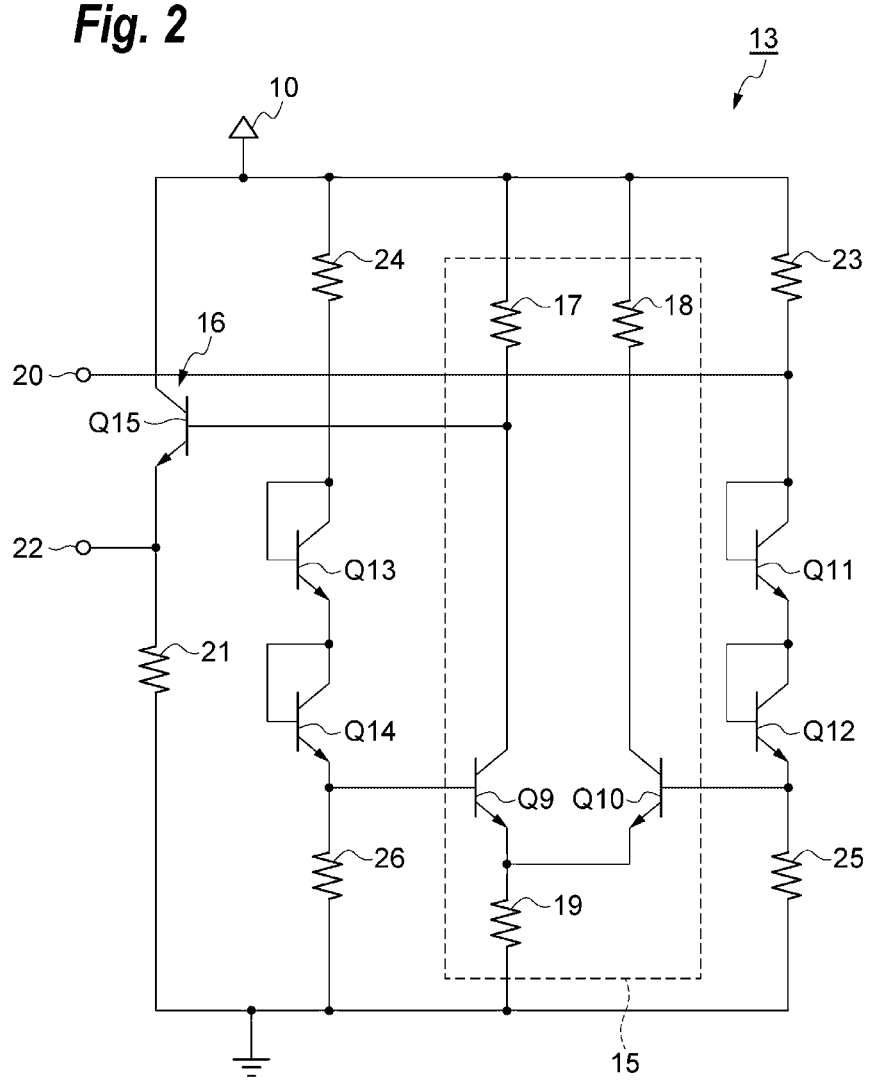
FIG. 2 is a specific circuit diagram of a feedback circuit illustrated in FIG. 1.

FIG. 2 is a specific circuit diagram of the feedback circuit 13 (controller). As illustrated in FIG. 2, the feedback circuit 13 (controller) includes a comparator 15 (voltage comparator) and an emitter follower 16.

The comparator 15 includes a pair of transistors Q9 and Q10, and resistors 17, 18, and 19. The emitters (first current terminals) of the transistors Q9 and Q10 are connected to each other and grounded through the resistor 19. The collector (second current terminal) of the transistor Q9 is connected to the power line 10 through the resistor 17. Likewise, the collector of the transistor Q10 is connected to the power line 10 through the resistor 18. Furthermore, the base (control terminal) of the transistor Q10 is connected to the power line 10 through two diode-connected transistors Q11 and Q12 for level-shifting, and a resistor 23. The base (control terminal) of the transistor Q10 is grounded through a resistor 25. The resistor 23, and the transistors Q11 and Q12 are connected to in series in this order from the power line 10. An input terminal 20 is electrically coupled to an interconnection between the resistor 23 and the transistor Q11. The base of the transistor Q9 is connected to the power line 10 through two diode-connected transistors Q13 and Q14 for level-shifting, and a resistor 24. The base of the transistor Q9 is grounded through a resistor 26. The resistor 24, and the transistors Q13 and Q14 are connected to in series in this order the power line 10. A series circuit (bias circuit) including the resistors 24 and 26 and the transistors Q13 and Q14 generates a referential voltage (reference signal) at the emitter of the transistor Q14. The referential voltage (reference signal) is input to the base of the transistor Q9.

In the feedback circuit 13 (controller) with such a configuration, the monitor voltage (monitor signal) input to the input terminal 20 is input to the comparator 15 after lowered by the transistors Q11 and Q12. The comparator 15 generates an output potential (intermediate signal) at the collector of the transistor Q9 in response to a differential potential (difference) between the input potential input to the base of the transistor Q10 and the referential potential input to the base of the transistor Q9. The output potential (current control signal) is output from the terminal 22 to the outside with an output impedance provided by the emitter follower 16 after converted from the intermediate signal by the emitter follower). The first current source 6 and the second current source 12 adjust the respective currents (first source current and second source current) thereof at the same rate in response to the output potential (current control signal).

For example, when the DC level (monitor signal) output from the terminal 11c is going larger (higher) than a predetermined value, the feedback circuit 13 (controller) changes the output potential (current control signal) output from the terminal 22 as to increase the current (first source current) of the second current source 12. Increase in the current (first source current) of the second current source 12 increases the current flowing through the resistive load 14 (load element) and thereby a voltage drop of the resistor 14. The increase in the voltage drop restrains the DC level (monitor signal) from going larger (higher). When the DC level (monitor signal) output from the terminal 11c is going less (lower) than the predetermined value, the feedback circuit 13 (controller) changes the output potential (current control signal) so as to decrease the current (second source current) of the second current source 12. Decrease in the current (second source current) of the second current source 12 decreases the current flowing through the resistor 14 and thereby the monitor signal generated from the voltage drop of the resistor 14 (monitor resistor). The decrease of the voltage drop restrains the DC level (monitor signal) from going less (lower). As has been described above, the feedback circuit 13 (controller) adjusts the output potential (current control signal) so as to always reduce the difference between the DC level (monitor signal) and thereby keep the DC level (monitor signal) output from the terminal 11c being equal to the predetermined value (reference signal). With such negative feedback control, the feedback circuit 13 (controller) automatically stabilizes the DC level (monitor signal) at a predetermined value. At the same time, the feedback circuit 13 (controller) stabilizes also the DC level of the output signals Voutp and Voutn at the predetermined value by controlling the first current source 6.

The predetermined value at which the feedback circuit 13 (controller) stabilizes the DC level (monitor signal) is set by the referential potential input to the base of the transistor Q9. The reference potential (reference signal) is determined by resistance of the resistors 24 and 26 and DC characteristics of the transistors Q13 and Q14.

The first current source 6 and the second current source 12 may be configured using, for example, bipolar transistors. For example, the emitters (first current terminals) of the bipolar transistors may be grounded, the output terminal of the feedback circuit 13 (controller) may be connected to the bases (control terminals) of the bipolar transistors, and the respective common terminals 3a and 11a of the differential circuits 3 and 11 may be connected to the collectors (second current terminals) of the bipolar transistors.

The operation and advantages of the variable gain differential amplifier 1 with the foregoing configuration will be described in conjunction with comparative examples.

Figure 5:
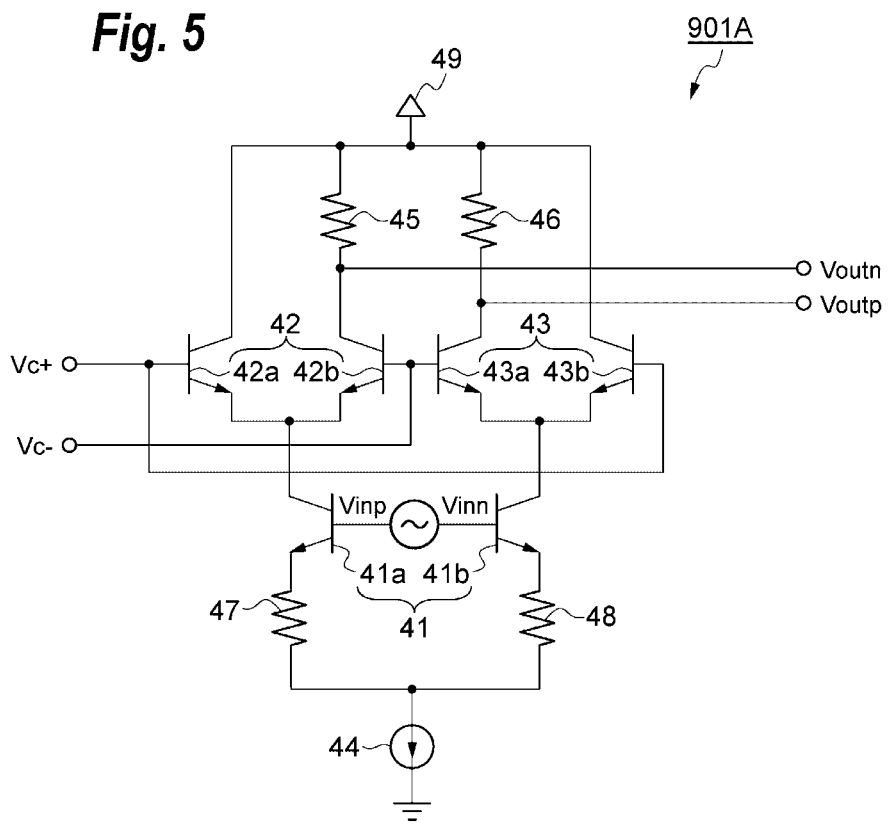
FIG. 5 is a circuit diagram of a variable gain differential amplifier according to a comparative example.

FIG. 5 is a circuit diagram of a variable gain differential amplifier 901A of a comparative example. The amplifier 901A has substantially the same configuration as the amplifying stage 1A of the variable gain differential amplifier 1 illustrated in FIG. 1. That is, the amplifier 901A has differential circuits 41 to 43, and a current source 44.

The differential circuit 41 includes a pair of transistors 41a and 41b. The emitters of the transistors 41a and 41b are connected to each other through resistors 47 and 48. The emitter (first current terminal) of the transistor 41a is connected to the current source 44 through the resistor 47. The emitter of the transistor 41b is connected to the current source 44 through the resistor 48. The complimentary input signals Vinp and Vinn are input to the bases of the transistors 41a and 41b, respectively.

The differential circuit 42 includes a pair of transistors 42a and 42b. The emitters of the transistors 42a and 42b are connected to each other, and are further connected to the collector of the transistor 41a. The collector of the transistor 42b is connected to a power line 49 through a resistive load 45. The collector of the transistor 42a is directly connected to the power line 49. The differential circuit 43 includes a pair of transistors 43a and 43b. The emitters of the transistors 43a and 43b are connected to each other, and are further connected to the collector of the transistor 41b. The collector of the transistor 43b is directly connected to the power line 49. The collector of the transistor 43a is connected to the power line 49 through a resistive load 46.

The gain control signal $Vc_+$ is input to the bases (control terminals) of the transistors 42a and 43b. The gain control signal $Vc_-$ is input to the bases (control terminals) of the transistors 42b and 43a. The gain control signal $Vc_+$ has a phase different by 180 degrees from the gain control signal $Vc_-$. When one of the gain control signals $Vc_+$ and $Vc_-$ has a positive phase, the other has a negative phase. The gain control signals $Vc_+$ and $Vc_-$ constitute a pair of signals (a gain control signal Vc), so that one moves complimentarily with the other. The respective currents flowing through the transistors 42b and 43a can be controlled by complimentarily changing the gain control signals $Vc_+$ and $Vc_-$, specifically inputting a potential difference $\Delta V$ between the gain control signals $Vc_+$ and $Vc_-$. The difference between voltage drops of the transistor 42b and the transistor 43a causes a potential difference between the collectors of the transistor 42b and the transistor 43a. The variable differential amplifier 901A outputs the potential difference as a differential output voltage.

Figure 6:
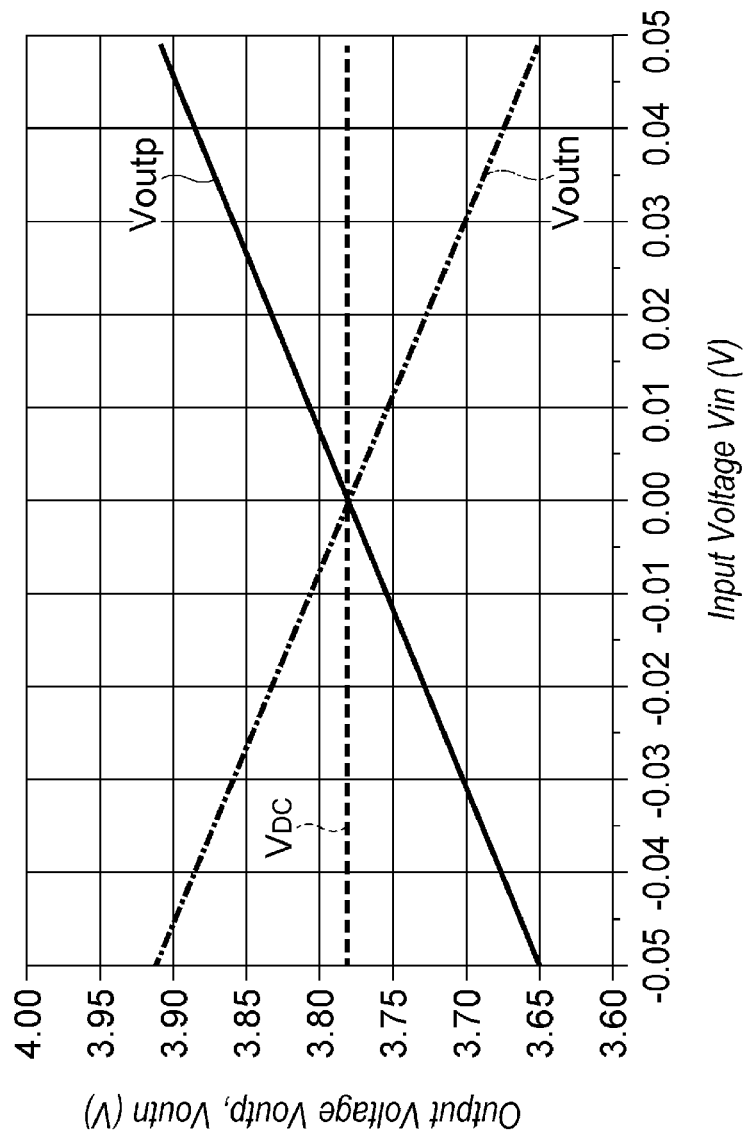
FIG. 6 is a graph representing the input-output characteristics of the variable gain differential amplifier illustrated in FIG. 5.

Now, behavior of the amplifier 901A will be discussed. FIG. 6 is a graph representing the input-output characteristics of the amplifier 901A illustrated in FIG. 5. The vertical axis of FIG. 6 indicates the potentials at the collectors of the transistors 42b and 43a (that is, voltages of output signals Voutn and Voutp). The horizontal axis of FIG. 6 indicates a differential input voltage Vin=Vinp−Vinn input to the bases of the transistors 41a and 41b. Here, assuming that the gain control signal Vc is kept constant, as illustrated in FIG. 6, the voltage difference between two output signals (that is, differential output voltage) Vout=Voutp−Voutn changes in response to the differential input voltage Vin. At that time, the DC voltage $V_{DC}$ (DC level) of the output signals Voutp and Voutn is kept constant. The DC voltage $V_{DC}$ in this case corresponds to a DC component that remains after excluding AC components from each of the output signals Voutp and Voutn, and is substantially equal to the average of each of the output signals Voutp and Voutn. Accordingly, when the mark rates of "0" level and "1" level included in the differential output voltage Vout are identical (that is 50%, respectively), the DC voltage $V_{DC}$ becomes substantially equal to the center level (potential) of the amplitude of each of the output signals Voutp and Voutn, and also the differential output signal. Alternatively, the DC voltage $V_{DC}$ may be considered as an average of the two output signals Voutp and Voutn.

Next, the following describes that the amplifier 901A has unstability in the DC voltage $V_{DC}$ when the voltage gain is varied. The gain control signals $Vc_+$ and $Vc_-$ are adjusted so as to change the potential difference between the output signals $\Delta V = Vc_+ - Vc_-$, defined as the gain control signal Vc. The potential difference $\Delta V$ determines a current $I_{43a}$ flowing through the transistor 43a as calculated by the following equation:

$$I_{43a}=(I_0-i_0)/\{1+\exp(-\Delta V/V_T)\}=f(\Delta V,T)\cdot I_0-f(\Delta V,T)\cdot i_0$$

where $V_T$ represents a thermal voltage. The current $I_{43a}$ includes a term of a DC component $I_0$ that has a coefficient $f(\Delta V, T)$ dependent on a temperature T of the transistor 43a and the potential difference $\Delta V$, and a term of an AC component $i_0$ that similarly has the coefficient $f(\Delta V, T)$. The output potential (the output voltage Voutp) at the collector of the transistor 43a depends on a voltage drop whose magnitude is in proportion to the current $I_{43a}$. And the other end (upper end) of the resistive load 46 is fixed to the power line 49. Therefore, changes in the voltage gain by adjusting the potential difference $\Delta V$ affects not only the amplitude of the differential output voltage (corresponding to the AC component $i_0$) but also the center level (potential) of the amplitude (corresponding to the DC component $I_0$), as the coefficient $f(\Delta V, T)$ changes in response to the potential difference $\Delta V$. In addition, a wide dynamic range in the input voltages provides more large changes in the amplitude and the center level of the output voltage even when the voltage gain (that is, the potential difference $\Delta V$) is kept constant. Such large changes in the center level may deteriorate distortion of amplification and distortion due to mismatch the output voltage thereof with the input range of an amplifier in downstream of the amplifier 901A.

Figure 7:
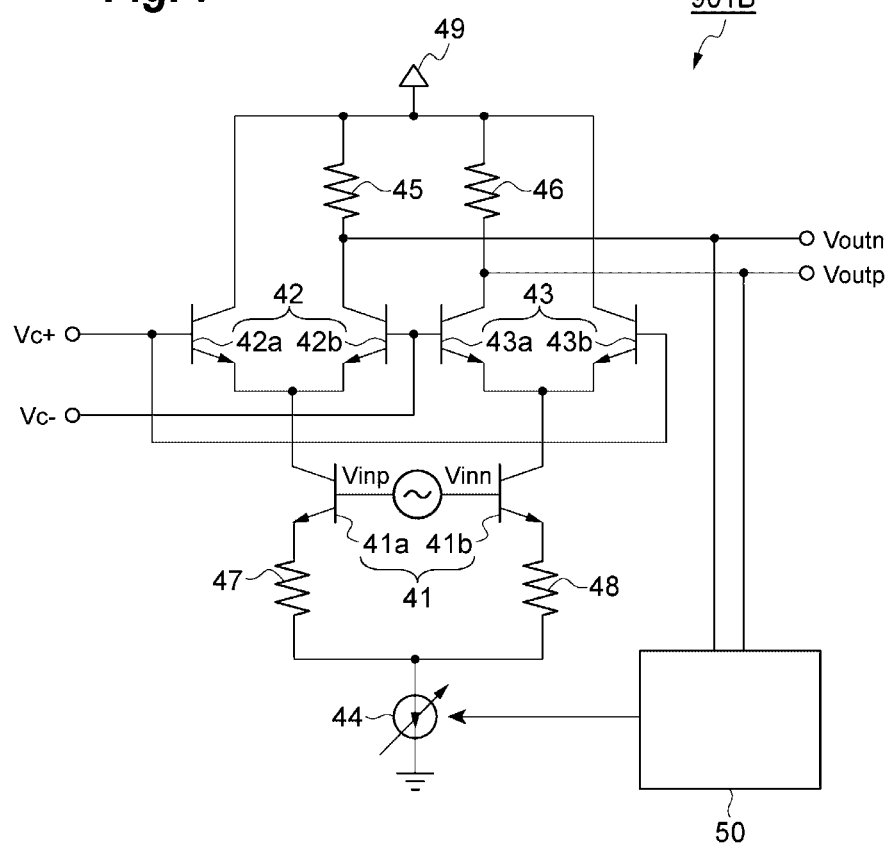
FIG. 7 is a circuit diagram of a variable gain differential amplifier according to another comparative example.

FIG. 7 is a circuit diagram of a variable gain differential amplifier 901B according to another comparative example. The amplifier 901B has a configuration for solving the above-mentioned unstability of the amplifier 901A. That is, the variable gain differential amplifier 901B has a feedback circuit 50 in addition to the configuration of the amplifier 901A. The feedback circuit 50 monitors the voltage $V_{DC}$ of the DC component of the output signals Voutp and Voutn, and adjusts a current supplied by the current source 44 in response to the voltage $V_{DC}$ by negative feedback control. For example, in the amplifier 901A, when the voltage gain is decreased by increasing the potential difference $\Delta V$ between the gain control signals $Vc_+$ and $Vc_-$, both the current that flows through the resistive load 45 and the current that flows the resistive load 46 decrease, and thereby the voltage $V_{DC}$ rises. In order to restrain the voltage $V_{DC}$ from rising, the feedback circuit 50 monitors the voltage $V_{DC}$ and increases the current source 44 in response to the voltage $V_{DC}$ by negative feedback control. That is, the feedback circuit 50 increases the current supplied by the current source 44 and thereby compensates the rising of the voltage $V_{DC}$ for stabilizing the voltage $V_{DC}$ at a predetermined value. Specifically, the current $I_{43a}$ that flows through the transistor 43a is calculated by the following equation:

$$I_{43a}=\{I_0(V_{DC})-i_0\}/\{1+\exp(-\Delta V/V_T)\}=f(\Delta V,T)\cdot I_0 \\ (V_{DC})-f(\Delta V,T)\cdot i_0$$

The current $I_{43a}$ includes a term of the DC component $I_0$ $(V_{DC})$ which has the coefficient $f(\Delta V, T)$. By adjusting the current supplied by the current source 44, the term of the DC component $I_0$ $(V_{DC})$ is stabilized at a predetermined value.

When a drive circuit drives an optical modulator by using a drive signal, the drive circuit needs to keep amplitude of the drive signal in a predetermined value. If the variable gain differential amplifier 901B works as such a drive circuit, when the voltage gain is decreased, keeping the amplitude of the drive signal in a predetermined value needs increasing the input differential voltage Vin=Vinp−Vinn so as to compensate for the gain reduction. However, in order to suppress distortion from arising against such a relatively large input differential voltage, the variable gain differential amplifier 901B needs to increase the current supplied by the current source 44. Thus, increase in the current of the current source 44 against the gain reduction (rise in the voltage $V_{DC}$) not only stabilizes (decreases) the voltage $V_{DC}$ but also suppresses distortion of amplification. On the other hand, the variable gain differential amplifier 901B includes the feedback circuit 50 to monitor the center potential of the output signals Voutp and Voutn, and control the current source 44 by negative feedback control. The feedback circuit 50 need a low-pass filter with a low cut-off frequency for obtaining the average of each of the output signals Voutp and Youth. Such a low pass filter comprises large resistors and a large capacitor for lowering the cut-off frequency. However, circuit configuration including large resistors and a large capacitor increases size of the feedback circuit 50. Such upsizing of the circuit is not suitable for downsizing of the optical transmitter that houses the optical modulator and the drive circuit.

In comparison with the above-mentioned variable gain differential amplifier 901B, the variable gain differential amplifier 1 of the embodiment may achieve circuit downsizing and power saving, while the DC level of the output signals Voutp and Voutn is stabilized. That is, the potential difference ΔV between the gain control signals $Vc_+$ and $Vc_-$, can change a ratio (first current ratio) of current flowing through the transistor Q4 to current flowing through the transistor Q3 in the second differential circuit 4 and also a ratio (second current ratio) of current flowing through the transistor Q5 to current flowing through the transistor Q6 in the third differential circuit 5 to adjust voltage gain of the variable gain differential amplifier 1. The first and second current ratios can be set to equal to each other. Furthermore, a ratio (third current ratio) of currents flowing through the transistor Q8 to current flowing through the transistor Q7 can be set to be equal to the above-mentioned ratios (first and second current ratios) in the fourth differential circuit 11, and the current that the current source 6 provides to the second and third differential circuits 4 and 5 and the current that the current source 12 provides to the fourth differential circuit 11 are simultaneously controlled in response to the potential (monitor signal) at the collector of the transistor Q8 of the fourth differential circuit 11. In particular, the feedback circuit 13 (controller) monitors a signal (monitor signal) generated at the collector of the transistor Q8 of the fourth differential circuit 11. The monitor signal corresponds to a DC signal that has no AC component (that only has a DC component), so that the feedback circuit 13 (controller) does not need a low-pass filter for averaging the monitor signal.

Such a circuit configuration can stabilize the DC level of the output signals Voutp and Voutn (and also an average of the output signals), while the voltage gain is varied by the control signals $Vc_+$ and $Vc_-$. The adjusting stage 1B can duplicate the current ratios of the second and third differential circuit 4 and 5 (first and second current ratios) to the third current ratio of the fourth differential circuit 11. The adjusting stage 1B can operate at power consumption less than that of the amplifying stage 1A, because the adjusting stage 1B does not have to amplify the input signals Vinp and Vinn and output the output signals Voutn and Voutp at high speeds. Moreover, the adjusting stage 1B does not affect the high speed operation of the amplifying stage 1A. Therefore, the variable gain differential amplifier 1 can reduce power consumption and circuit size thereof in comparison with the variable gain differential amplifier 901B according to the another comparative example. In addition, the adjusting stage 1B may use the same supply voltage as the amplifier stage 1A, and need no additional supply voltages. The adjusting stage 1B has only one current source (second current source 12) except the feedback circuit 13 (controller), so that the current consumed by the adjusting stage 1B can be minimized. Accordingly, the variable gain differential amplifier 1 further brings such advantages suitable for power saving. Furthermore, eliminating a low-pass filter for removing AC signals from a monitor signal allows the variable gain differential amplifier 1 to achieve circuit downsizing.

Figure 3:
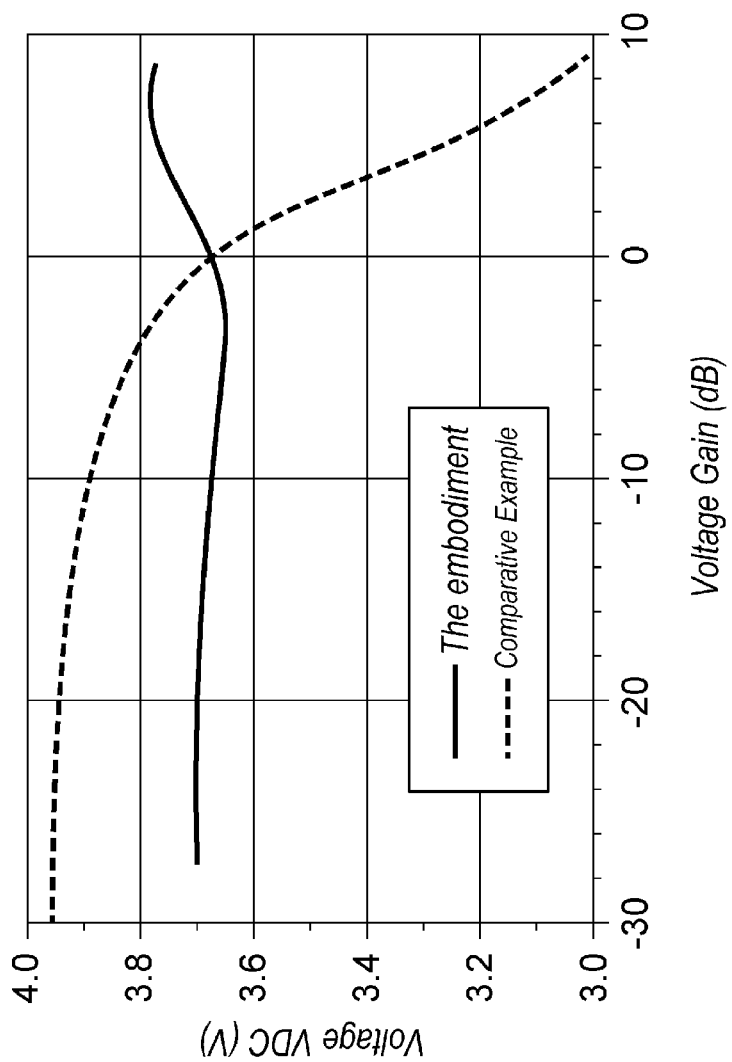
FIG. 3 is a graph representing the voltage gain dependence of the DC level of an output signal according to the embodiment.
Figure 4:
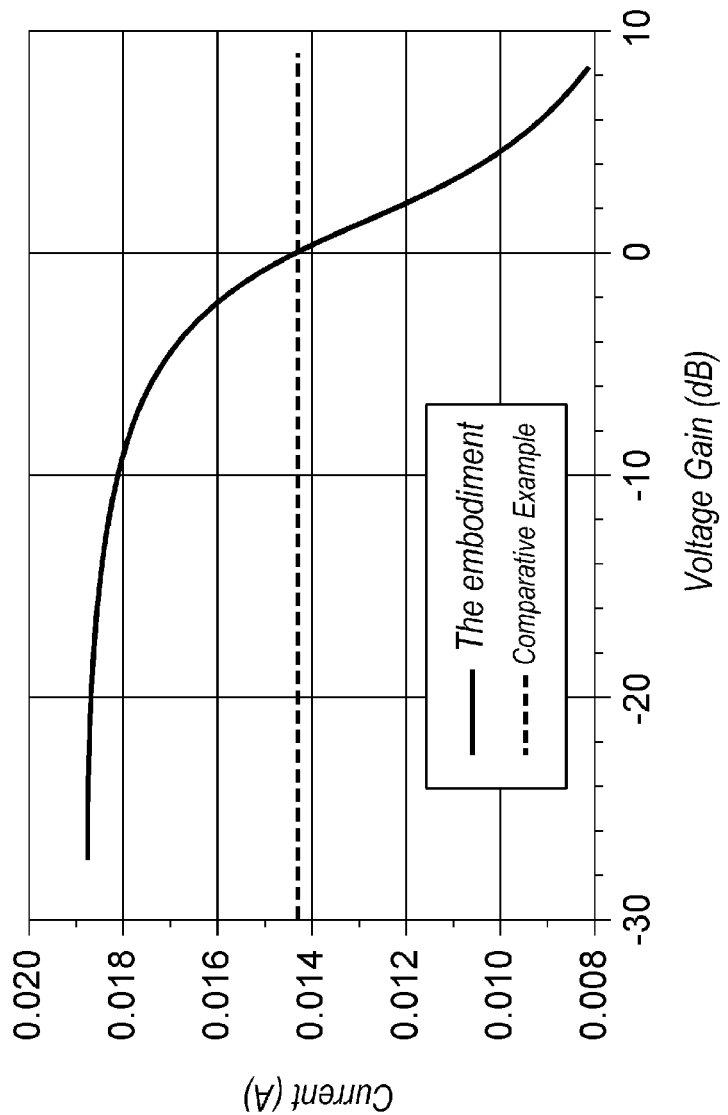
FIG. 4 is a graph representing the voltage gain dependence of a current supplied by a current source according to the embodiment.

FIG. 3 is a graph representing the voltage gain dependence of the voltage $V_{DC}$ (the DC level of the output signals Voutn and Voutp) according to the embodiment. FIG. 4 is a graph representing the voltage gain dependence of the current supplied by the current source 6 according to the embodiment. In these graphs, the horizontal axis indicates the voltage gain Gain=20·log{(Voutp−Voutn)/(Vinp−Vinn)} when the differential input voltage Vin=Vinp−Vinn is amplified to generate the differential output voltage Vout=Voutp−Voutn. Referring to FIGS. 3 and 4, a solid line indicates the characteristics according to the embodiment, and a dotted line indicates the characteristics of a configuration excluding the adjusting stage 1B (comparative example). As is clear from these characteristics, in the circuit configuration without the feedback control by the adjusting stage 1B, the source current supplied by the current source 6 is kept constant regardless of the voltage gain. As a current that flows through a resistive load depends on the voltage gain, the voltage $V_{DC}$ (DC level) greatly falls with increase in the voltage gain. In contrast, the circuit configuration with the feedback control by the adjusting stage 1B according to the embodiment may adjust the current supplied by the current source 6 in response to the voltage gain, and accordingly suppress deviations of the voltage $V_{DC}$ (DC level).

What is claimed is:

1. A differential amplifier that generates an output signal derived from an input signal, the output signal and input signal each having a positive phase signal and a negative phase signal, comprising:
    an amplifying stage that generates the output signal, the amplifying stage including,
        a first current source that supplies a first source current,
        a first differential circuit that divides the first source current into a first current and a second current in response to the input signal,
        a second differential circuit that divides the first current into a third current and a fourth current by a current ratio, the second differential circuit generating the negative phase signal of the output signal, the negative phase signal of the output signal having a potential proportional to the fourth current,
        a third differential circuit that divides the second current into a fifth current and a sixth current by the current ratio, the third differential circuit generating the positive phase signal of the output signal, the positive phase signal of the output signal having a potential proportional to the fifth current; and
    an adjusting stage that generating a current control signal, the adjusting stage including,
        a second current source that supplies a second source current,
        a fourth differential circuit that divides the second source current into a seventh current and an eight current by the current ratio, the fourth differential circuit generating a monitor signal, the monitor signal having a potential proportional to the eighth current,
        a controller that generates the current control signal in response to the monitor signal,
    wherein the current ratios of the fourth current to the third current, the fifth current to the sixth current, and the eighth current to the seventh current are identical and depend on a gain control signal provided externally, and wherein the first source current and the second source current are controlled in response to the current control signal.

2. The differential amplifier according to claim 1, wherein the controller includes a bias circuit that generates a reference signal, and wherein the current control signal is generated from a difference between the monitor signal and the reference signal.

3. The differential amplifier according to claim 2, wherein the controller further includes a voltage comparator, and an emitter follower, wherein the voltage comparator generates an intermediate signal in response to the difference between the monitor signal and the reference signal, and wherein the emitter follower converts the intermediate signal into the current control signal.

4. The differential amplifier according to claim 1, wherein the second source current is set to a quotient of the first source current by a coefficient greater than 1.

5. The differential amplifier according to claim 4, wherein the amplifying stage further includes a first element and second element each having a first resistance, wherein the negative phase signal of the output signal is generated from a voltage drop of the first element caused by the fourth current, and the positive phase signal of the output signal is generated from a voltage drop of the second element caused by the fifth current, wherein the adjusting stage further includes a third element having a second resistance, wherein the monitor signal is generated from a voltage drop of the third element caused by the eighth current, wherein the second resistance is set to a product of the first resistance and the coefficient.

6. The differential amplifier according to claim 5, wherein the second differential circuit and third differential circuit comprise first transistors having a first size, and the fourth differential circuit comprises second transistors having a second size, wherein the second size is set to a product of the first size and the coefficient.

7. A differential amplifier that outputs an output signal by amplifying an input signal with a gain set by a gain control signal provided externally, comprising:

an amplifying stage including a first current source, a first element, and a second element, the amplifying stage being configured to divide a first source current supplied by the first source current into a first current and a second current in response to the input signal, and further divide the first current into a third current that flows through the first element and a fourth current by a current ratio, and further divide the second current into a fifth current that flows through the second element and a sixth current by the current ratio, and output a difference between potentials of one ends of the first element and the second element as the output signal, an adjusting stage including a second current source, and a third element, the adjusting stage being configured to divide a second source current supplied by the second current source into an eighth current that flows through the third element and seventh current by the current ratio, and control the first source current and the second source current in response to a monitor potential generated at one end of the third element, wherein the current ratios of the fourth current to the third current, the fifth current to the sixth current, and the eighth current to the seventh current are identical and depend on the gain control signal.

8. The differential amplifier according to claim 7, wherein the first element and the second element each have an identical resistance.

9. The differential amplifier according to claim 8, wherein the adjusting stage further includes a controller that provide a current control signal to the first current source and the second current source, wherein the controller includes a bias circuit that generates a reference potential, wherein the current control signal is generated from a difference between the monitor potential and the reference potential.

10. The differential amplifier according to claim 9, wherein the controller further includes a voltage comparator, and an emitter follower, wherein the voltage comparator generates an intermediate signal in response to the difference between the monitor signal and the reference signal, and wherein the emitter follower converts the intermediate signal into the current control signal.

11. The differential amplifier according to claim 8, wherein the second source current is set to a quotient of the first source current by a coefficient greater than 1.

12. The differential amplifier according to claim 11, wherein the third element has a resistance equal to a product of the identical resistance and the coefficient.

13. The differential amplifier according to claim 12, wherein the second differential circuit and third differential circuit comprise first transistors having a first size, wherein the fourth differential circuit comprises second transistors having a second size, wherein the second size is set to a product of the first size and the coefficient.

* * * * *